United States Patent
Dastidar et al.

(10) Patent No.: US 7,409,669 B1
(45) Date of Patent: Aug. 5, 2008

(54) AUTOMATIC TEST CONFIGURATION GENERATION FACILITATING REPAIR OF PROGRAMMABLE CIRCUITS

(75) Inventors: Jayabrata Ghosh Dastidar, Santa Clara, CA (US); Paul J. Tracy, Sunnyvale, CA (US); Adam Wright, San Jose, CA (US)

(73) Assignee: Altera Corporation, San Jose, CA (US)

( * ) Notice: Subject to any disclaimer, the term of this patent is extended or adjusted under 35 U.S.C. 154(b) by 602 days.

(21) Appl. No.: 10/459,187

(22) Filed: Jun. 10, 2003

(51) Int. Cl.
*G06F 17/50* (2006.01)
(52) U.S. Cl. .............................. 716/16; 716/4; 716/13
(58) Field of Classification Search .............. 716/4–5, 716/12–14, 16–17; 714/725; 326/38, 40, 326/41
See application file for complete search history.

(56) References Cited

U.S. PATENT DOCUMENTS

| | | | |
|---|---|---|---|
| 4,845,633 A * | 7/1989 | Furtek | 326/38 |
| 6,181,163 B1 * | 1/2001 | Agrawal et al. | 326/41 |
| 6,211,695 B1 * | 4/2001 | Agrawal et al. | 326/40 |
| 6,466,050 B1 * | 10/2002 | Mohammed et al. | 326/38 |
| 6,487,709 B1 * | 11/2002 | Keller et al. | 716/14 |
| 6,919,736 B1 * | 7/2005 | Agrawal et al. | 326/41 |
| 6,973,608 B1 * | 12/2005 | Abramovici et al. | 714/725 |

OTHER PUBLICATIONS

Data Sheet Tetramax ATPG, Automatic Test Pattern Generation, Synopsys, Mountain View, CA, 2001.
Fastscan and the ATPG Product Family, Design-for-Test Datasheet, Mentor Graphics, 2003.

* cited by examiner

*Primary Examiner*—Stacy A Whitmore
(74) *Attorney, Agent, or Firm*—Townsend and Townsend and Crew LLP

(57) ABSTRACT

Techniques are provided that control the generation of test routes to improve the ability of a test system to isolate defects on programmable circuits. A test generator creates test routes that test the horizontal resources. In these test routes, the inputs of each circuit element are only connected to other circuit elements in the same row. Test routes are also generated to test the vertical resources. Each of theses test routes is allowed to make only one transition from between two different rows of circuit elements. The configuration generator includes a post processor that ensures all source drivers in the test routes connect to at least two sinks.

9 Claims, 4 Drawing Sheets

AUTOMATIC TEST CONFIGURATION GENERATION FACILITATING REPAIR OF PROGRAMMABLE CIRCUITS

BACKGROUND OF THE INVENTION

The present invention relates to automatic test configuration generation techniques for facilitating the repair of programmable circuits, and more particularly, to techniques for constraining the generation of test routes on a programmable circuit according to rules designed to facilitate the isolation and repair of defects.

Integrated circuits sometimes fail to operate properly as a result of defects. For example, the die of an integrated circuit may become scratched. The integrated circuit may fail to operate properly as a result of the scratch. As another example, circuit failures may be caused by a short that develops in the integrated circuit.

A programmable integrated circuit, such as a programmable logic device (PLD), is thoroughly tested after manufacturing to screen for any defects. When a defect is detected on a programmable circuit, a failed row of programmable circuit elements can be replaced with an extra redundant row of programmable circuit elements.

Programmable logic devices such as Altera's Stratix family of PLDs include rows and columns of programmable logic elements. Each logic element includes a register and a look-up table (LUT). During the production test phase of a PLD, the registers in each logic element are configured as scan chain registers. The scan registers are coupled together in test routes. Each test route connects a control point register and to an observation point register.

The logic elements are tested by applying test vectors at the control points. The test vectors are shifted into the control point registers. Output values for each test route are shifted out of the observation point registers. The output values are compared to expected values to determine if any programmable connections in the test route between the control point and the observation point have defects.

If the output values indicate a failure, the row at the observation point is replaced with a redundant row. This only eliminates a failure if the defect causing the failure exists in the row at the observation point.

Many types of PLDs use vertical drivers that drive signals from one row of logic elements to the next. In Stratix PLDs, there is no way to drive a signal into the same row the signal originated from using a single vertical driver. In Stratix, a vertical driver drives a signal between at least two different rows. When a vertical driver is coupled in a test route, an error observed at an observation point in one row may be caused by a defect that exists in a different row. Current test systems do not have a fast and effective way of determining which of two or more rows contains a defect.

One technique for identifying a row that contains a defect is now discussed. Each LUT in the route between the control point and the observation point is configured as an XOR gate. Then, every possible combination of input signals to each of the XOR gates are tested to determine which input is the source of the defect. For example, if a configured XOR gate has two inputs, then four combinations of logic signals (1 and 0) are applied to the two inputs to determine which input is defective. This test procedure is very difficult and time consuming to apply during production testing, because it requires tracking failures across multiple LUTs by applying numerous test vectors.

It would therefore be desirable to provide a more efficient mechanism for isolating defects on programmable circuits during production testing. It would also be desirable to provide techniques for isolating a localized failure on a programmable circuit that has vertical drivers.

BRIEF SUMMARY OF THE INVENTION

The present invention provides techniques for repairing failures on programmable circuits. Programmable circuits include integrated circuits such as PLDs, field programmable gate arrays, programmable logic arrays (PLAs), and configurable logic arrays. The techniques of the present invention control the generation of test routes to improve the ability of a test system to isolate defects on a programmable circuit. Both programmable interconnects and programmable logic elements can be repaired using the techniques of the present invention.

Embodiments of the present invention include techniques for testing the horizontal resources on a programmable circuit. A test generator creates test routes that are used to test the horizontal resources in each row of circuit elements. For testing horizontal resources, the inputs of each circuit element (e.g. logic element) in a test route are connected only to other circuit elements in the same row. This embodiment of the present invention eliminates the need to determine which row an erroneous value originated from. If an error is observed at any observation point, the observation row is replaced. In this embodiment, there is no need to test each combination of input signals into the circuit element to identify the row that a failure is located in.

Additional embodiments of the present invention include techniques for isolating defects in test routes that contain vertical drivers. Many programmable circuits have vertical drivers that can drive a signal between vertical interconnects and between vertical and horizontal interconnects. The present invention prevents test routes from making more than one transition between rows of circuit elements so that defects in vertical resources that connect to horizontal resources can be isolated. These techniques greatly improve the ability of the test system to identify a vertical resource that is causing a failure. Resources that connect one vertical driver to another vertical driver are filtered out and tested separately.

Further embodiments of the present invention include techniques for distinguishing between a failure in a source and a sink. A configuration generator generates a configuration pattern of test routes across a programmable circuit. The configuration generator includes a post processor that ensures all source drivers in the test routes connect to at least two sinks. Stored data specifies the sink connections to each source in the test routes. When a failure is identified in a test route that contains a vertical driver, the source row is replaced if all of its sink connections are failing. If only one of the sink connections generates a failure, then the row containing the failing sink is replaced.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIG. 4 is a diagram that illustrates how a failure in a programmable circuit can be caused by a defect in a row other than the row that the control and observation points are located in;

DETAILED DESCRIPTION OF THE INVENTION

Figure 1:
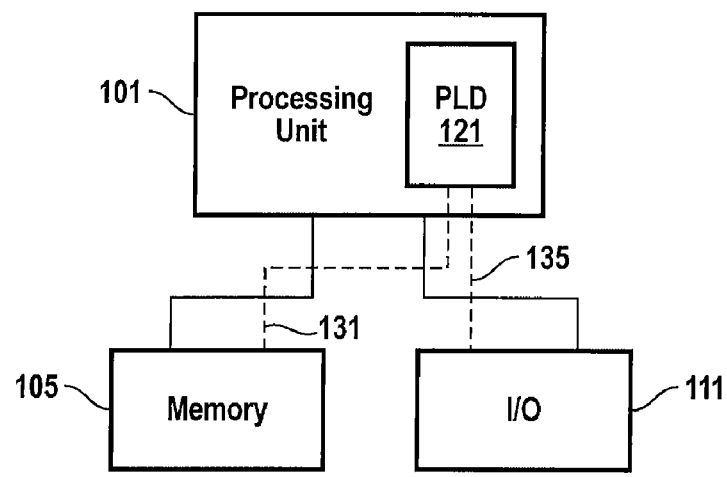
FIG. 1 is diagram of a digital system with a programmable logic integrated circuit.

FIG. 1 shows a block diagram of a digital system within which the present invention may be embodied. The system may be provided on a single board, on multiple boards, or even within multiple enclosures. FIG. 1 illustrates a system 101 in which a programmable logic device 121 may be utilized.

Programmable circuits include PALs, PLAs, FPLAs, PLDs, CPLDs, EPLDs, EEPLDs, LCAs, or FPGAs. These are well-known integrated circuits that provide the advantages of fixed integrated circuits with the flexibility of custom integrated circuits. Such devices allow a user to electrically program standard, off the shelf logic elements to meet a user's specific needs. Programmable logic devices are currently represented by, for example, Altera's Stratix series of PLDs. Programmable logic integrated circuits and their operation are well known to those of skill in the art.

In the particular embodiment of FIG. 1, a processing unit 101 is coupled to a memory 105 and an I/O 111 and incorporates a programmable logic device (PLD) 121. PLD 121 may be specially coupled to memory 105 through connection 131 and to I/O 111 through connection 135. The system may be a programmed digital computer system, digital signal processing system, specialized digital switching network, or other processing system. Moreover, such systems may be designed for a wide variety of applications such as, merely by way of example, telecommunications systems, automotive systems, control systems, consumer electronics, personal computers, and others.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, or other processing unit. Furthermore, in many embodiments, there is often no need for a CPU. For example, instead of a CPU, one or more PLDs 121 may control the logical operations of the system. In some embodiments, processing unit 101 may even be a computer system. Memory 105 may be a random access memory (RAM), read only memory (ROM), fixed or flexible disk media, PC Card flash disk memory, tape, or any other storage retrieval means, or any combination of these storage retrieval means. PLD 121 may serve many different purposes within the system in FIG. 1. PLD 121 may be a logical building block of processing unit 101, supporting its internal and external operations. PLD 121 is programmed to implement the logical functions necessary to carry on its particular role in system operation.

Figure 2:
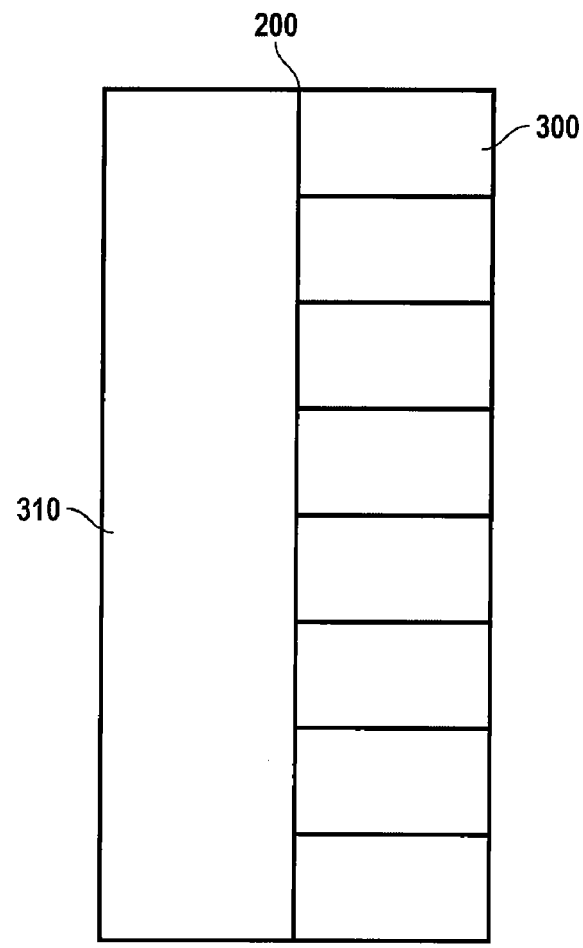
FIG. 2 is a simplified block diagram of a logic array block (LAB)

FIG. 2 shows a simplified block diagram of LAB 200. LAB 200 is comprised of a varying number of logic elements (LEs) 300, sometimes referred to as "logic cells." LAB 200 also includes a local (or internal) interconnect structure 310. LAB 200 has eight LEs 300, but LAB 200 may have any number of LEs, more or less than eight.

A general overview of LE 300 is presented here, sufficient to provide a basic understanding of the present invention. LE 300 is the smallest logical building block of a PLD. Signals external to the LAB, such as from global horizontal and vertical interconnect, are programmably connected to LE 300 through local interconnect structure 310. In one embodiment, LE 300 of the present invention incorporates a function generator that is configurable to provide a logical function of a number of variables, such a four-variable Boolean operation. As well as combinatorial functions, LE 300 also provides support for sequential and registered functions using, for example, D flip-flops.

LE 300 provides combinatorial and registered outputs that are connectable to the global interconnect, outside LAB 200. Furthermore, the outputs from LE 300 may be internally fed back into local interconnect structure 310; through local interconnect structure 310, an output from one LE 300 may be programmably connected to the inputs of other LEs 300, without using the global interconnect structure. Local interconnect structure 310 allows short-distance interconnection of LEs, without utilizing the limited global resources.

Figure 3:
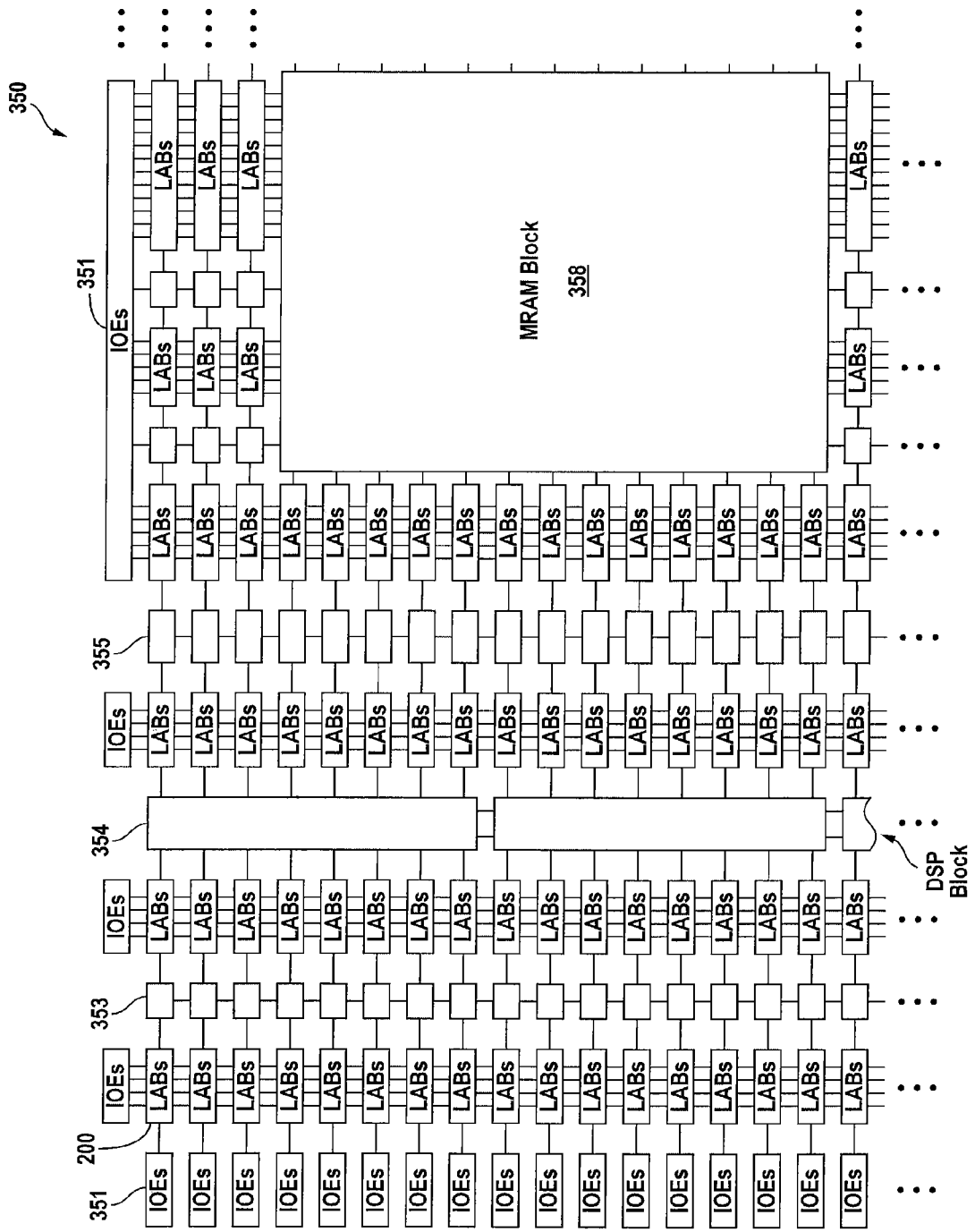
FIG. 3 is a simplified block diagram of a programmable logic device that can be tested according to techniques of the present invention.

FIG. 3 is a simplified partial block diagram of an exemplary high-density PLD 350 wherein the techniques of the present invention can be utilized. PLD 350 includes a two-dimensional array of programmable logic array blocks (or LABs) 200 that are interconnected by a network of global vertical and horizontal (column and row) interconnects of varying length and speed. LABs 200 include multiple (e.g., 10) logic elements (LEs), as shown in FIG. 2. An LE is typically a small unit of logic that provides for efficient implementation of user defined logic functions. An LE can include a look-up table and a register.

PLD 350 also includes a distributed memory structure including RAM blocks of varying sizes provided throughout the array. The RAM blocks include, for example, 512 bit blocks 353, 4K blocks 355 and a MegaBlock 358 providing 512K bits of RAM. These memory blocks can also include shift registers and FIFO buffers. PLD 350 further includes digital signal processing (DSP) blocks 354 that can implement, for example, multipliers with add or subtract features. I/O elements (IOEs) 351 located, in this example, around the periphery of the device are used to transmit signals into and out of PLD 350. It is to be understood that PLD 350 is described herein for illustrative purposes only and that the present invention can be implemented in many different types of PLDs, FPGAs, and the like.

As discussed above, traditional test techniques measure output values from observation points on programmable circuits and compare the output values to expected values to identify failures. If an output value indicates a failure, the row coupled to the observation point is typically replaced with a redundant row. However, this technique only eliminates a failure if the defect causing the failure is in the same row as the observation point.

Figure 4:
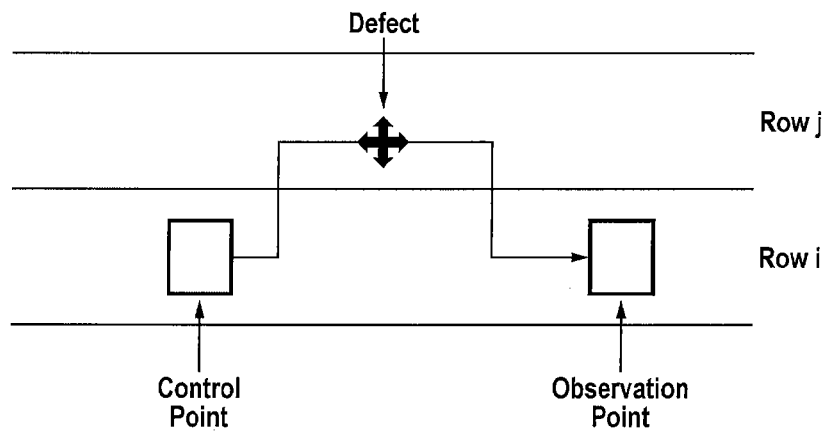

FIG. 4 shows a test routes that illustrates an example of this problem. After a test vector is applied to a control point in row i, an error is observed at an observation point in row i. The defect causing the error actually lies in row j as shown in FIG. 4. Therefore, replacing row i with a redundant row does not eliminate the defect in row j. The row that contains the defect cannot be identified merely by analyzing the standard output received at the observation point.

A test generator creates test routes that are designed to test interconnect resources and programmable circuit elements (e.g., LEs). As discussed above, each test route typically connects a register at a control point to a register at an observation point. In some embodiments of the present invention, each test route includes only two logic elements, an LE that includes the control point register and an LE that includes the observation point register. No other LEs are coupled between the control point and observation point registers. In these embodiments, each test route connects a register in a first logic element to a register in a second logic element.

PLDs typically have numerous programmable logic elements (LEs). LEs are merely one example of programmable circuit elements that can be tested using the principles of the present invention. Although the present invention is discussed primarily in the context of testing LEs in PLDs, this discussion is not intended to limit the scope of the present invention. It should be understood that other types of circuit elements can be tested using the principles of the present invention.

The test routes are grouped into configuration patterns. All of the test routes in a configuration pattern can be programmed onto a programmable integrated circuit and tested in one test cycle. Each programmable connection is used only one time in each configuration pattern.

According to a first embodiment of the present invention, the inputs of each logic element in a test route must be connected to source logic elements that are all in the same row. If a logic element input cannot be connected to a source in the same row as another source input, then that LE input is not connected to anything in that particular test configuration pattern. This may happen, for example, if there are no more source connections that can be made in a particular row.

This embodiment of the present invention eliminates the need to determine which row caused an erroneous value. For example, if output test values indicate that one of the inputs of a logic element is generating an erroneous value, the row that the logic elements inputs are connected to is replaced with a redundant row. In this embodiment, there is no need to test each combination of input signals into the logic element to identify which input is causing the failure, because all of the inputs to each logic element are connected to the same row.

Figure 5A:
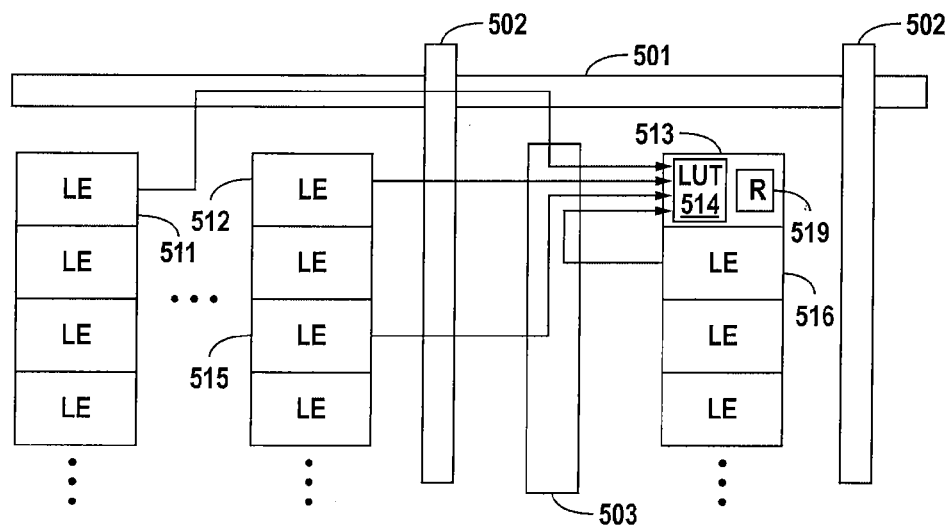
FIGS. 5A and 5B are diagrams that illustrate how circuit elements that connect to inputs of a logic element in a test route are required be within the same row in order to test the horizontal resources according to an embodiment of the present invention.
Figure 5B:
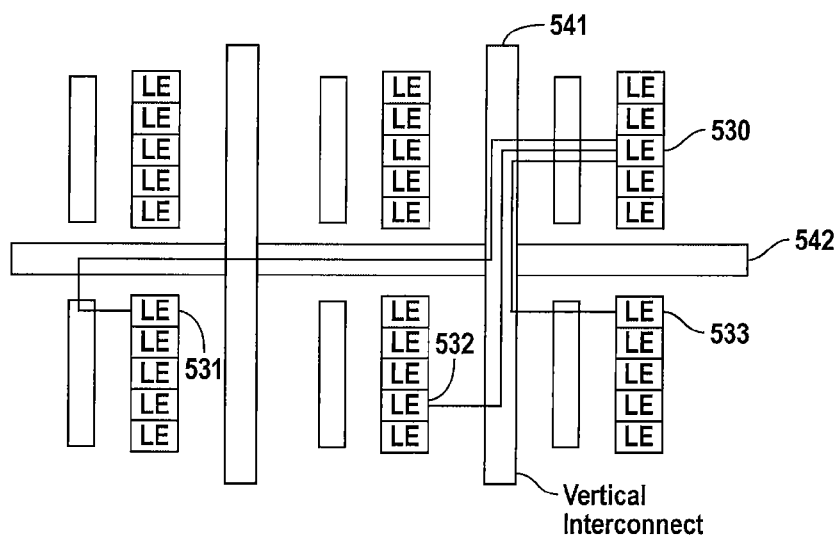

FIGS. 5A and 5B illustrates how a test generator can apply the first embodiment of the present invention to generate test routes. FIG. 5A illustrates examples of this embodiment.

Four complete test routes are shown in FIG. 5A. LE 513 is the observation point for each of the four test routes, and register 519 is the observation point register. Look-up table (LUT) 514 inside logic element (LE) 513 has four inputs. Each of the four inputs of LUT 514 receives an input signal from another logic element that is in the same row as LE 513. LUT 514 receives input signals from adjacent LEs, LEs that are located in adjacent columns, and LEs that are located in non-adjacent columns.

LUT 514 receives signals from source logic elements 511, 512, 515, and 516. Each of these LEs are in the same row of LABs. If observation point register 519 in LE 513 records an erroneous value during test, the repair mechanism may determine that the defect causing the erroneous value originates from one of the four inputs of LUT 514. Because all four inputs of LUT 514 are in the same row, that row of logic elements is replaced with a redundant row to eliminate the defect. This technique ensures that the defect is properly eliminated from the PLD.

In FIG. 5A, all four test routes lie entirely within the same row of LABs. By requiring that all the registers in each test route lie entirely within the same row, the horizontal resources on a programmable integrated circuit are isolated so that they can be tested for defects. If each test route includes only two registers (a control register in a first logic element and an observation register in a second logic element), then both logic elements are in the same row of LABs as shown in FIG. 5A.

Signals from each of LEs 511, 512, 515, and 516 are routed to LE 513 through local interconnect 503. Signals from LE 511 are also routed through horizontal interconnect 501. Signals from the source LEs are not routed through vertical interconnect 502. Thus, test routes that lie entirely within one row as shown in FIG. 5A can be used to isolate and test the horizontal interconnect on a programmable integrated circuit as well as the logic elements in each row.

An LE in a test route can receive its input signals from a row other than the row the LE is located in, as long as all of its input signals originate from the same row. FIG. 5B illustrates examples of these types of test routes. LE 530 includes a LUT. The LUT in LE 530 receives input signals from LEs 531, 532, and 533. LEs 531-533 are all located in the same row. LE 530 is located in a different row that LEs 531-533. Signals from LEs 531-533 are routed through vertical interconnect 541 and horizontal interconnect 542 in addition to various local interconnect resources.

If the scan register in LE 530 records an erroneous value during test, the repair mechanism may determine that the defect causing the erroneous value originates from one of the three inputs of LE 530. If one the 3 inputs of LE 530 is causing the error, the repair mechanism replaces the row that includes LEs 531-533 with a redundant row to eliminate the defect.

The techniques discussed with respect to FIGS. 5A and 5B constrain the router that places the test configurations on the PLD. As discussed above, the router is limited to making connections such that all inputs of an LE receive signals that originate from the same row in order to isolate the row containing the defect. Because of this constraint, the router may need to generate more test routes and configuration patterns to test all or substantially all of the resources on a PLD than a system that imposed no constraints on the router.

One possible alternative is to limit the router so that it can connect only one input of a LUT to a source in each configuration pattern. In general, this alternative requires test generator to generate more configuration patterns than the embodiment of FIGS. 5A and 5B. Therefore, by allowing connections to more than one LUT input, more of the LUT inputs can be tested in each configuration pattern, and less configuration patterns need to be generated.

LUTs are just one example of circuit elements that can be constrained according to this embodiment of the present invention. The present invention includes techniques for controlling connections to the inputs of other types of circuit elements in a programmable integrated circuit.

According to a second embodiment of the present invention, the vertical resources on a programmable circuit are tested for defects. A test generator creates test routes that are designed to test vertical resources such as vertical drivers that programmably connect to vertical interconnects.

According to this embodiment, test routes are allowed to connect resources in two different rows in order to test the vertical resources. Each test route generated using this constraint is only allowed to make one transition between two different rows. Once a test route can transitions from a first row to a second row of circuit elements, the router only permits the test route to connect to additional circuit elements that are in the second row. This embodiment facilitates the process of isolating failed vertical resources. This embodiment does not test vertical drivers that connect one vertical interconnect to another vertical interconnect.

Figure 6:
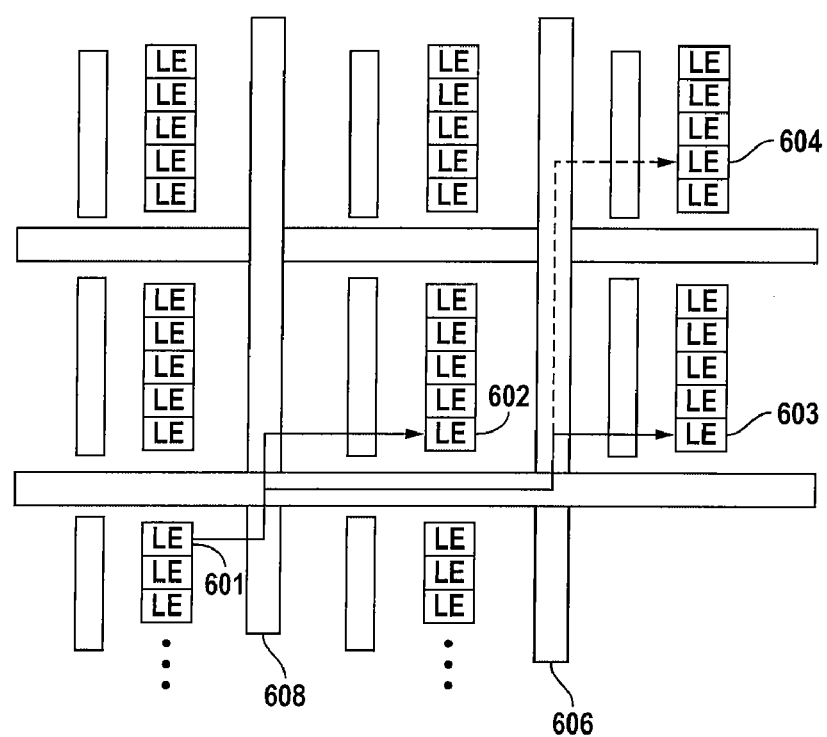
FIG. 6 is a diagram that illustrates how interconnections in a test route are limited to only one transition between rows in order to test the vertical interconnection resources according to an embodiment of the present invention.

FIG. 6 illustrates how a test generator can apply this embodiment of the present invention to generate configuration patterns. The two solid arrows in FIG. 6 represent a test route with three LEs that is generated according to this embodiment of the present invention. The test route connects LE 601 to LEs 602 and 603. The output of LE 601 connects to vertical interconnect 608. Vertical interconnect 608 connects LE 601 to LE 602 and LE 603. LEs 602-603 are in a different row than LE 601.

According to this embodiment of the present invention, the router allows each test route to have only one transition between two rows of LABs. The test route in FIG. 6 transitions between a first row that includes LE 601 and a second row that includes LEs 602 and 603. This test route is not permitted to include any additional transitions between rows. For example, the router does not permit the connection to LE 604 through interconnect 606 shown by the dotted arrow in FIG. 6. If the test route were connected to LE 604 as shown by the dotted arrow, the test route would include two transitions between different rows, which is not allowed by this embodiment.

As discussed above, the FIG. 6 test routes are generated to test the vertical resources. The test routes for the vertical resources can be a second set of test routes that are generated and tested after the horizontal resources are tested and repaired using a first set of tests that are generated as discussed above with respect to FIG. 5A. When the test routes for the vertical resources are generated, the test generator has already determined that the horizontal resources are functional based on the tests and repairs performed using the embodiment of FIG. 5A. Therefore, if an erroneous value is detected from the second set of tests, it is likely that the failure is caused by a defect in one of the vertical resources not tested during the first set of tests.

For example, if an error is detected at the scan register in LE 602, one of the vertical resources associated with vertical interconnect 608 is likely to be the source of a defect causing the error. The test routes in FIG. 5B are also examples of test routes that can be used to test the vertical resources, because there is only one transition between rows shown in each test route.

In a third embodiment of the present invention, a PLD repair mechanism can distinguish between a failure occurring at a source driver and a failure occurring at one of its sinks. A sink is any circuit element that receives an input signal from a source driver. Any register can act as a source or a sink, such as input/output register or a register inside a logic element.

This embodiment of the present invention ensures that the output of each source driver in the test routes is coupled to at least two different sinks. Once the configuration generator has completed a configuration pattern that includes the test routes, a post processor analyzes the configuration pattern. The post processor determines if there are any source drivers that are only connected to one sink. If the post processor finds a single-sink source driver, it attempts to connect that source driver to a second sink. If the post processor fails to make this connection, it destroys the test route starting from the single-sink source driver and places all of the resources in the destroyed portion of the test route back into the queue of edges yet to be routed.

Thus, the post processor guarantees that every source driver is connected to at least two different sinks. After the processing is completed, the test generator creates a file for each source driver. Each file records the sinks that are connected to a source. These files are used to repair or replace defects. The size of each file should be proportional to the number of scan registers in a configuration pattern. If, for example, all scan registers are associated with a logic element of 4 inputs, each register can occur at most 4 times in the list, one for each input connection. Further details of a system for automatically generating test routes on a programmable circuit and storing the test routes in a connectivity graph are discussed in further detail in commonly-assigned U.S. patent application Ser. No. 10/323,506 to Dastidar et al. filed Dec. 18, 2002, which is incorporated by reference herein.

Figure 7:
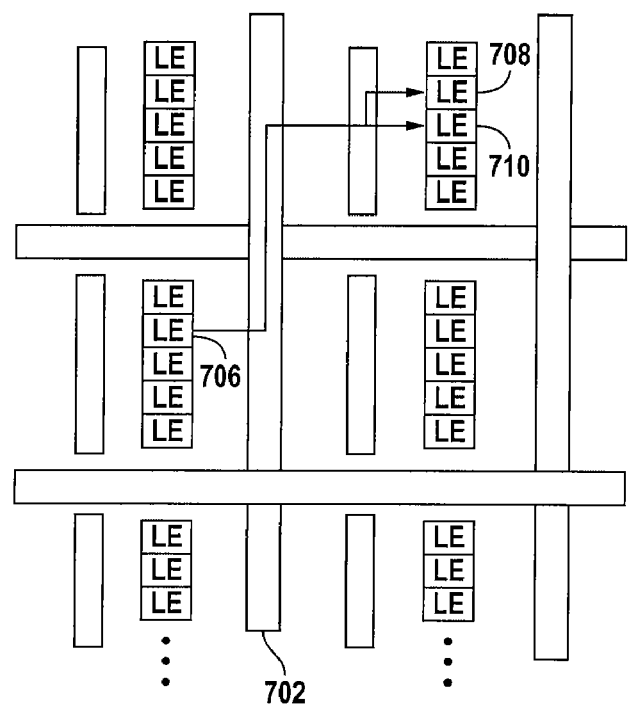
FIG. 7 is a diagram of that illustrates how errors in source connections are distinguished from errors in two or more sink connections according to an embodiment of the present invention.

FIG. 7 illustrates an example of the third embodiment of the present invention. LEs 706, 708, and 710 are logic elements that are coupled in a test route. LE 706 is designated as a source driver. The output of LE 706 is coupled to two different sinks. The two sinks are LEs 708 and 710 as shown in FIG. 7.

When the test system identifies a failure in a vertical test such as the one shown in FIG. 7, the position of the failing scan register is recorded. The source register associated with the failing sink register is looked up. The test systems looks up all the sink connections to the source register in the files. If all of the sinks connected to a source are generating erroneous values, the row that the source driver is located in is replaced with a redundant row. If less than all of the sinks connected to a source are generating erroneous values, the row that the failed sink (or sinks) is located in is replaced with a redundant row.

For example, if the test system determines both of the LE 708 and 710 scan registers record erroneous values, the test system assumes that the defect is in the source row where LE 706 is located and replaces that row. If only one of the LE 708 or LE 710 scan registers records an erroneous value, then the row that includes LEs 708 and 710 is replaced.

This embodiment of the present invention allows a PLD test system to determine whether a defect is more likely to be in a source row or a sink row. When a source driver is only coupled to one sink in a test route, there is no means for determining whether a defect causing an error lies in the source row or the sink row. The present invention provides techniques for determining whether a defect is more likely to lie in a source row or a sink row. These techniques are based on the assumption that a single defect in a source row driver is more likely to be the cause of an erroneous value in two or more sinks connected to that source, than two or more defects in the sink row(s). Single defect assumption is a standard practice in the field of test generation.

The present invention includes several embodiments for controlling the generation of configuration patterns that are used to test resources on a programmable circuit. The connections made in each test route are subject to constraints that increase the likelihood of being able to isolated and repair a defect. The actual repair techniques that are used to repair a defect include any one of numerous well-known repair techniques. Replacing failed rows or failed columns with redundant rows or columns are examples of repair techniques that can be used according to the principles of the present invention. Other repair techniques can also be used.

The present invention has several advantages over previously known repair systems. Programmable circuits typically contain regular arrays of logic elements as well as an irregular programmable interconnect structure. Identifying errors that are generated by an irregular interconnect structure can be a difficult task. The present invention provides techniques that facilitate the isolation and repair of defects in programmable circuits that have an irregular programmable interconnect structure.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiment disclosed, but that the invention will include all embodiments and equivalents falling within the scope of the claims.

What is claimed is:

1. A method for generating test routes across a programmable circuit that comprises vertical and horizontal programmable interconnects, the horizontal programmable interconnects defining rows of circuit elements there between, the method comprising:

coupling circuit elements in test routes such that each source circuit element is coupled to at least two sink circuit elements within the test routes;

coupling circuit elements in the test routes such that all of the source circuit elements coupled to a particular sink circuit element are in the same row of circuit elements; and coupling the circuit elements in the test routes such that each of the test routes transitions between any two of the rows of circuit elements no more than one time to isolate at least one defect.

2. The method of claim 1 wherein the test routes comprise first test routes and second test routes, circuit elements in each of the first test routes residing in only one of the rows, and circuit elements in each of the second test routes residing in two of the rows.

3. The method of claim 1 wherein the test routes couple circuit elements in two of the rows through the vertical programmable interconnects.

4. The method of claim 1 wherein coupling the circuit elements in the test routes such that each source circuit element is coupled to at least two sink circuit elements within the test routes further comprises:

coupling the circuit elements to form preliminary test routes;

analyzing the preliminary test routes to determine if any of the source circuit elements are coupled to only one sink circuit element; and for each of the source circuit elements that are only coupled to one sink circuit element, attempting to complete the test route such that each source circuit element added to the test route is coupled to at least two sink circuit elements, and if that fails, destroying the test route starting from that source circuit element.

5. The method of claim 4 further comprising:

storing data indicating connections between each source circuit element and its sink circuit elements in files.

6. A computer system for generating test routes across a programmable circuit that comprises rows of circuit elements, the computer system comprising:

code for constraining the generation of the test routes such that each source circuit element in the test routes are coupled to at least two sink circuit elements;

code for constraining the generation of the test routes such that all of the source circuit elements coupled to a sink circuit element are in the same row of circuit elements; and code for constraining the generation of the test routes such that each of the test routes is prevented from transitioning between any two of the rows of circuit elements more than once to isolate at least one defect.

7. The computer system of claim 6 wherein the test routes couple circuit element in two of the rows through the vertical programmable interconnects.

8. The computer system of claim 6 wherein the code for constraining the generation of the test routes such that each source circuit element in the test routes are coupled to at least two sink circuit elements further comprises:

code for forming preliminary test routes; and code for analyzing the preliminary test routes to identify source circuit elements are coupled to only one sink circuit element, and for these source circuit elements, attempting to complete the test route such that each source circuit element added to the test route is coupled to at least two sink circuit elements, and if that fails, destroying the test route starting from that source circuit element.

9. The computer system of claim 6 wherein the programmable circuit is a programmable logic device and the circuit elements are programmable logic elements.

* * * * *